United States Patent [19]

Terashima et al.

[11] Patent Number: 5,726,598
[45] Date of Patent: Mar. 10, 1998

[54] SEMICONDUCTOR DEVICE HAVING VOLTAGE SENSING ELEMENT

[75] Inventors: Tomohide Terashima, Hyogo; Masanori Fukunaga, Fukuoka, both of Japan

[73] Assignee: Mitsubishi Denki Kabushiki Kaisha, Tokyo, Japan

[21] Appl. No.: 743,567

[22] Filed: Nov. 4, 1996

Related U.S. Application Data

[60] Continuation of Ser. No. 424,939, Apr. 19, 1995, abandoned, which is a division of Ser. No. 343,945, Nov. 17, 1994, Pat. No. 5,500,541.

[30] Foreign Application Priority Data

Apr. 27, 1994 [JP] Japan ................................ 6-089462

[51] Int. Cl.$^6$ ........................................ H03K 5/153
[52] U.S. Cl. ................ 327/325; 327/583; 327/504; 327/80; 327/565
[58] Field of Search ........................ 327/50, 80, 583, 327/325, 306, 309, 314, 315, 318, 320, 321, 322, 330, 471, 472, 493, 504, 585, 565; 257/105, 106, 481, 551, 603

[56] References Cited

U.S. PATENT DOCUMENTS

| | | | |
|---|---|---|---|
| 2,927,267 | 3/1960 | Petritz et al. | 327/504 |
| 4,119,869 | 10/1978 | Hashimoto | 327/583 |
| 4,198,607 | 4/1980 | Beinitz et al. | 327/50 |
| 4,211,941 | 7/1980 | Schade, Jr. | |
| 4,810,907 | 3/1989 | Tohyama | 327/80 |
| 4,926,068 | 5/1990 | Fujita | 327/50 |
| 5,329,190 | 7/1994 | Igarashi et al. | 327/80 |
| 5,467,050 | 11/1995 | Clapp, III et al. | 327/314 |

FOREIGN PATENT DOCUMENTS

| | | |
|---|---|---|
| 0108945 | 5/1984 | European Pat. Off. |
| 16 39 177 B 2 | 7/1977 | Germany |

*Primary Examiner*—Timothy P. Callahan
*Assistant Examiner*—Eunja Shin
*Attorney, Agent, or Firm*—Lowe, Price, LeBlanc & Becker

[57] ABSTRACT

A semiconductor device having a voltage sensing element is disclosed which allows reduction of power consumption in comparison with a conventional device and enables to obtain a sufficient output voltage to secure sensing accuracy even when an input voltage is small. In the voltage sensing element of the semiconductor device, an n$^-$ layer is formed on a front surface of a p$^-$ substrate. A p type diffused region and an n type diffused region are formed at a main surface of n$^-$ layer, spaced apart by a prescribed distance. An electrode is formed on p type diffused region, and an electrode is formed on n type diffused region. An electrode is formed on a rear surface of p$^-$ substrate. P$^-$ substrate and n$^-$ layer constitute a diode in a reversely biased state. As a result, power consumption is reduced in comparison with a conventional voltage dividing resistor circuit.

6 Claims, 10 Drawing Sheets

SEMICONDUCTOR DEVICE HAVING VOLTAGE SENSING ELEMENT

This application is a continuation of application Ser. No. 08/424,939 filed Apr. 19, 1995 now abandoned, which is a divisional application of application Ser. No. 08/343,945 filed Nov. 17, 1994, now U.S. Pat. No. 5,500,541.

BACKGROUND OF THE INVENTION

1. Field of the Invention

The present invention relates generally to semiconductor devices, and more particularly, to a semiconductor device having a voltage sensing element for sensing an output voltage.

2. Description of the Background Art

Conventionally, a voltage sensing element for monitoring an output voltage is provided, for example, in a circuit for driving a fluorescent lamp. FIG. 19 is an equivalent circuit diagram showing a conventional circuit for driving a fluorescent lamp. Referring to FIG. 19, in a conventional circuit for driving a fluorescent lamp, a power device bridge including insulated gate bipolar transistors (IGBT) 101 and 102 is connected to a power source $V_{cc}$. A fluorescent lamp is represented by capacitance C and connected between insulated gate bipolar transistors 101 and 102. Insulated gate bipolar transistor 101 has a gate connected to a control circuit 106 in an IC 104. Insulated gate bipolar transistor 102 has a gate connected to a control circuit 107 in an IC 105.

A voltage dividing resistor circuit (a voltage sensing element) consisting of resistors 110a and 110b is connected between insulated gate bipolar transistors 101 and 102. One end of resistor 110a is connected to control circuit 106. The connecting portion of resistors 110a and 110b is connected to control circuit 107.

In a conventional circuit for driving fluorescent lamp, it is necessary to monitor an output voltage V1 to control the same. As output voltage V1 can rise as high as approximately 200V, the output voltage cannot be directly input to control circuits 106 and 107. Accordingly, a conventional circuit for driving fluorescent lamp requires a voltage sensing element for inputting an appropriate low voltage to control circuits 106 and 107. A voltage dividing resistor circuit (110a, 110b) is conventionally used as such a voltage sensing element.

However, a conventional circuit for driving a fluorescent lamp has a problem that resistors 110a and 110b consume much electric power because of high voltage applied to resistors 110a and 110b constituting the voltage dividing resistor circuit. Furthermore, when output voltage V1 is low, the voltage divided in proportion to resistance will be quite small. Therefore, when output voltage V1 is low, output voltage V1 cannot be measured very accurately by the conventional voltage dividing resistor circuit.

SUMMARY OF THE INVENTION

An object of the present invention is to provide a semiconductor device allowing reduction in power consumption by a voltage sensing element.

Another object of the present invention is to provide a semiconductor device in which sufficient accuracy in measuring an output voltage can be obtained even when the output voltage is low.

A further object of the present invention is to provide a semiconductor device allowing reduction in power consumption and allowing normal measuring operation of an output voltage even when the output voltage is negative.

A semiconductor device according to one aspect of the present invention has a voltage sensing element for sensing an output voltage. The voltage sensing element includes a first semiconductor layer, a first semiconductor region, a second semiconductor region, a second semiconductor layer, a first electrode, and a second electrode. The first semiconductor layer has front and rear surfaces, and is of a first conductivity type. The first semiconductor region is formed in a prescribed region at the front surface of the first semiconductor layer and has a second conductivity type. The second semiconductor region is formed at the front surface of the first semiconductor layer spaced apart from the first semiconductor region by a prescribed distance, and has the first conductivity type. The second semiconductor layer is formed on the rear surface of the first semiconductor layer and has the second conductivity type. The first electrode is formed in contact with the first semiconductor region. The second electrode is formed in contact with the second semiconductor region.

In this semiconductor device, when a voltage of 0V is applied to a third electrode formed in contact with the second semiconductor layer and a positive voltage is applied to the second electrode formed in contact with the second semiconductor region, a depletion layer extends from a junction region of the first and second semiconductor layers. A diode constituted by the first and second semiconductor layers is reversely biased. The first electrode connected to the first semiconductor region is set to the state of floating in the depletion layer. The voltage of the first electrode comes to be correlated with change in that of the second electrode and lower than that of the second electrode. Therefore, when an output voltage is applied to the second electrode, a voltage, which correlates with and is lower than the output voltage, is easily obtained from the first electrode. Since a diode constituted by the first and second semiconductor layers is in a reversely biased state, very little current flows through the diode. Consequently, power consumption can be made smaller than in a conventional voltage sensing element including the voltage dividing resistor circuit. The voltage of the first electrode is almost the same as that of the second electrode until the depletion layer reaches the first semiconductor region. Therefore, the voltages of the first and second electrodes are almost the same when the output voltage applied to the second electrode is small. As a result, a higher voltage can be obtained from the first electrode than in the prior art even when the output voltage applied to the second electrode is small.

In a semiconductor device according to another aspect of the present invention, a voltage sensing element includes a first semiconductor layer first through third semiconductor regions, a conductive layer, a resistor, a second semiconductor layer, and first through third electrodes. The third semiconductor region is formed at a surface of the second semiconductor region, and has a second conductivity type. The conductive layer is formed in contact with surfaces of second and third semiconductor regions. The resistor is formed between the second and third semiconductor regions. The second semiconductor layer is formed on a rear surface of the first semiconductor layer, and has the second conductivity type. The first electrode is formed in contact with the first semiconductor region. The second electrode is formed in contact with the third semiconductor region. The third electrode is formed in contact with the second semiconductor layer. The resistor can preferably be a diffusion resistor in the third semiconductor region. The conductive layer can preferably be configured to include the resistor.

In this semiconductor device, when a diode constituted by the first and second semiconductor layers is forwardly biased, the forward bias voltage is reduced by the resistor formed between the second and third semiconductor regions. As a result, a depletion layer is rapidly formed when the voltage applied to the diode changes from forward bias to reverse bias. Therefore, instant increase in the potential in the first semiconductor region can be avoided when there is a change from forward bias to reverse bias.

In a semiconductor device according to a further aspect of the present invention, a voltage sensing element includes a first semiconductor layer, first through fourth semiconductor regions, a conductive layer, a resistor, and first through third electrodes. The second semiconductor region is formed at a front surface of the first semiconductor layer spaced apart from the first semiconductor region by a prescribed distance, and has a second conductivity type. The third semiconductor region is formed at the front surface of the first semiconductor layer spaced apart from first and second semiconductor regions by a prescribed distance, and has a first conductivity type. The fourth semiconductor region is formed at a surface of the third semiconductor region and has the second conductivity type. The conductive layer is formed in contact with surfaces of the third and fourth semiconductor regions. The resistor is formed between the third and fourth semiconductor regions. The first electrode is formed in contact with the first semiconductor region. The second electrode is formed in contact with the second semiconductor region. The third electrode is formed in contact with the fourth semiconductor region. The semiconductor device can preferably be configured to include a second semiconductor layer formed on a rear surface of the first semiconductor layer with an insulating layer posed therebetween and a fourth electrode formed in contact with the second semiconductor layer.

In this the semiconductor device, when a diode formed of the first semiconductor region and the first semiconductor layer is forwardly biased, the forward bias is reduced by the resistor formed between the third and fourth semiconductor regions. As a result, a depletion layer is rapidly formed when there is a change from forward bias to reverse bias. Therefore, instant increase in the potential in the first semiconductor region can be avoided when the voltage applied to the diode formed by the first semiconductor region and the first semiconductor layer changes from a forward bias voltage to a reverse bias voltage.

In a semiconductor device according to still another aspect of the present invention, a voltage sensing element includes a first semiconductor layer, first through fifth semiconductor regions, a conductive layer, a resistor, a second semiconductor layer, and first through third electrodes. The second semiconductor region is formed at a front surface of the first semiconductor layer spaced apart from the first semiconductor region of a second conductivity type by a prescribed distance, and has a first conductivity type. The third semiconductor region is formed in a prescribed region at a surface of the second semiconductor region and has the second conductivity type. The fourth semiconductor region is formed at the surface of the second semiconductor region spaced apart from the third semiconductor region by a prescribed distance and has the second conductivity type. The fifth semiconductor region is formed at a surface of the fourth semiconductor region and has the first conductivity type. The conductive layer is formed in contact with the surfaces of the second and fourth semiconductor regions. The resistor is formed between the second and fourth semiconductor regions. The second semiconductor layer is formed on a rear surface of the first semiconductor layer and has the second conductivity type. The first electrode is formed in contact with the first semiconductor region. The second electrode is formed in contact with the third and fifth semiconductor regions. The third electrode is formed in contact with the second semiconductor layer.

In this semiconductor device, a forward bias voltage applied to a diode consisting of the first and second semiconductor layers is reduced by voltage drop at the resistor formed between the second and fourth semiconductor regions and voltage drop due to the threshold voltage applied to a diode constituted by the fourth and fifth semiconductor regions, even if the diode consisting of the first and second semiconductor layers is forwardly biased. The amount of holes introduced to the first semiconductor layer is decreased. As a result, a depletion layer is rapidly formed even when the voltage applied to the diode consisting of the first and second semiconductor layers changes from a forward bias voltage to a reverse bias voltage. Therefore, instant increase in the potential in the first semiconductor region instantly increases.

In a semiconductor device according to still another aspect of the present invention, a voltage sensing element includes input and output terminals, first and second rectifying elements, and a constant-current source. An output voltage is input to the input terminal. The first rectifying element has a cathode connected to the input terminal and an anode connected to the output terminal. The second rectifying element has a cathode connected to the input terminal and an anode connected to the ground. The constant-current source is connected between the anodes of the first and second rectifying elements.

In this semiconductor device, the voltage applied to the input terminal can be easily obtained from the output terminal as a lower voltage, because the first and second rectifying elements are provided in a reversely biased state between the input and output terminals of the voltage sensing element. Since the first and second rectifying elements are provided in a reversely biased state, very little current flows between the input and output terminals. As a result, power consumption can be made smaller than in a conventional voltage sensing element including a voltage dividing resistor circuit.

In a semiconductor device according to still another aspect of the present invention, a voltage sensing element includes input and output terminals, second and third rectifying elements, a resistor, and a constant-current source. The third rectifying element has an anode connected to the input terminal and a cathode connected to the cathodes of the first and second rectifying elements. The resistor is connected between the anode and the cathode of the third rectifying element. The constant-current source is connected between the anodes of the first and second rectifying elements. A fourth rectifying element can preferably be provided between the resistor and the anode of the third rectifying element so that a rectified current flows from the resistor to the anode of the third rectifying element.

In this semiconductor device, since the resistor is provided between the first and second rectifying elements and the input terminal, the forward bias voltage is reduced by the resistor even when the forward bias voltage is applied to the first and second rectifying elements. As a result, instant increase in the voltage of the output terminal can be avoided when the voltage applied to the first and second rectifying elements changes from forward bias to reverse bias.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described below with reference to the drawings.

Figure 1:
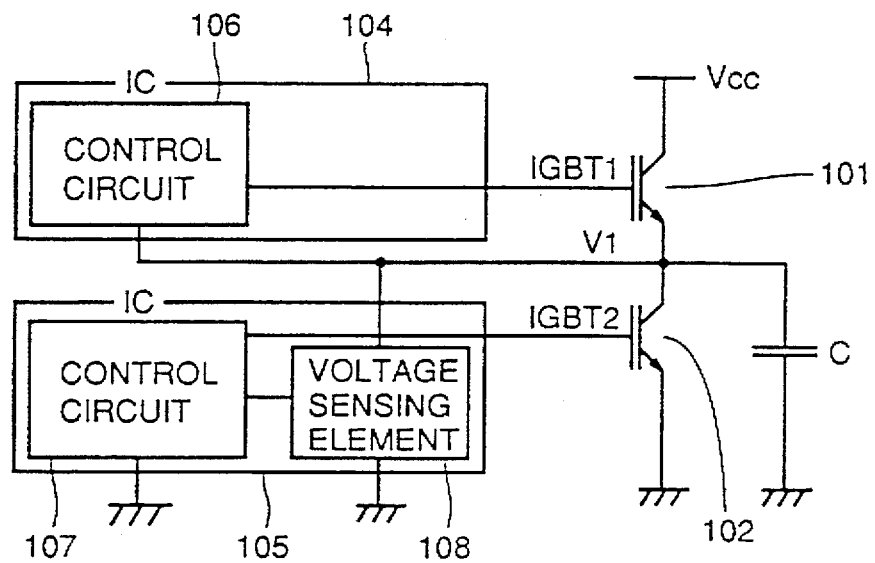
FIG. 1 is an equivalent circuit diagram showing a semiconductor device (circuit for driving a fluorescent lamp) including a voltage sensing element in accordance with a first embodiment of the present invention.
Figure 2:
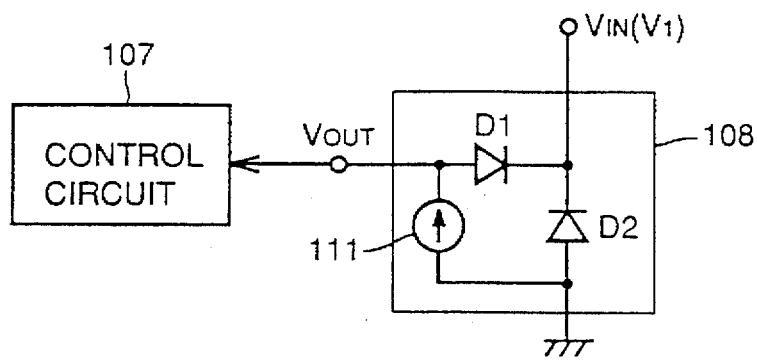
FIG. 2 is an equivalent circuit diagram showing a circuitry of the voltage sensing element of the first embodiment shown in FIG. 1.

First, referring to FIGS. 1 and 2, a voltage sensing element 108 includes two diodes D1 and D2 and a constant-current source 111 in a semiconductor device of the first embodiment. Specifically, diode D1 is located in a reversely biased state between an input terminal $V_{IN}$ and an output terminal $V_{OUT}$ of voltage sensing element 108. Diode D2 has a cathode connected to a cathode of diode D1 and input terminal $V_{IN}$, and an anode connected to the ground. Constant-current source 111 is connected between an anode of diode D1 and the anode of diode D2.

Figure 3:
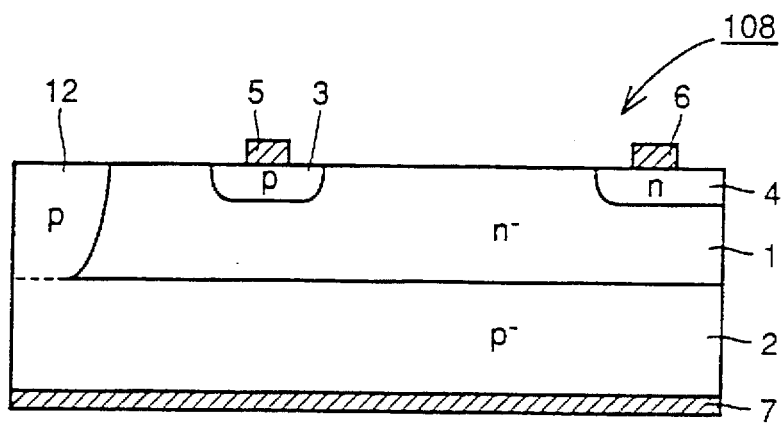
FIG. 3 is a cross sectional view showing a structure of the voltage sensing element of the first embodiment shown in FIG. 2.
Figure 4:
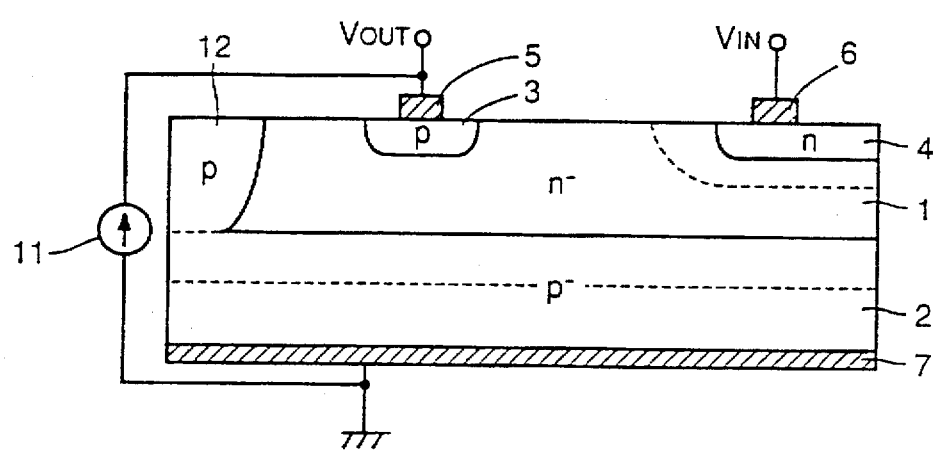
FIG. 4 is a cross sectional view showing operation of the voltage sensing element of the first embodiment shown in FIG. 3.

Referring to FIGS. 3 and 4, a cross sectional structure of the voltage sensing element of the first embodiment will be described. An n⁻ layer 1 is formed on a front surface of a p⁻ substrate 2. A p type diffused region 3 and an n type diffused region 4 are formed at a surface of n⁻ layer 1 spaced apart by a prescribed distance. A p type diffused region 12 is formed, spaced apart from p type diffused region 3 by a prescribed distance and extending from a main surface of n⁻ layer 1 to p⁻ substrate 2. An electrode 5 is formed in contact with a surface of p type diffused region 3. An electrode 6 is formed in contact with a surface of n type diffused region 4. An electrode 7 is formed on a rear surface of p⁻ substrate 2. Diode D2 shown in FIG. 2 is constituted by n⁻ layer 1 and p⁻ substrate 2. Diode D1 shown in FIG. 2 is constituted by p type diffused region 3 and n⁻ layer 1.

Referring to FIG. 4, operation of voltage sensing element 108 of the first embodiment will be described. An electrode 7 is connected to the ground, and a positive voltage is applied to electrode 6 which is to serve as an input terminal. A depletion layer extends upward and downward from a junction region of n⁻ layer 1 and p⁻ substrate 2 to the region represented by the dotted lines in FIG. 4. In this state, diode D2 consisting of p⁻ substrate 2 and n⁻ layer 1 and diode D1 consisting of p type diffused region 3 and n⁻ layer 1 are reversely biased.

In this state, electrode 5 which is to serve as an output terminal is floating in the depletion layer. Therefore, the voltage of electrode 5 correlates with, and is lower than, the voltage of electrode 6. If a constant current is supplied to electrode 5 by using constant-current source 11, the potential of electrode 5 in a floating state can be stably obtained. Such operation makes it possible to obtain the voltage of electrode 6 (input terminal) as a lower voltage from electrode 5 (output terminal).

In the voltage sensing element of the first embodiment shown in FIGS. 2 and 4, very little current flows between electrodes 6 and 7 because diode D2 consisting of n⁻ layer 1 and p⁻ substrate 2 is reversely biased. Therefore, the electric power consumed by the voltage sensing element of the first embodiment is determined by the voltage of electrode 5 and the constant current flowing from constant-current source 11 to electrode 5. The voltage of electrode 5 is approximately 20V at most because it is an output voltage to a control circuit. Therefore, the power consumption by voltage sensing element 108 of the first embodiment is sufficiently smaller than that of a conventional voltage sensing element including a dividing circuit.

The voltages of electrodes 5 and 6 are almost the same until the depletion layer reaches p type diffused region 3. As a result, the voltage of electrode 5 is sufficient to measure even when an output voltage V1 (the voltage of electrode 6) is small unlike a conventional voltage sensing element. This enables accurate sensing of the voltage of electrode 6 even when output voltage V1 (the voltage of electrode 6) is small.

Figure 5:
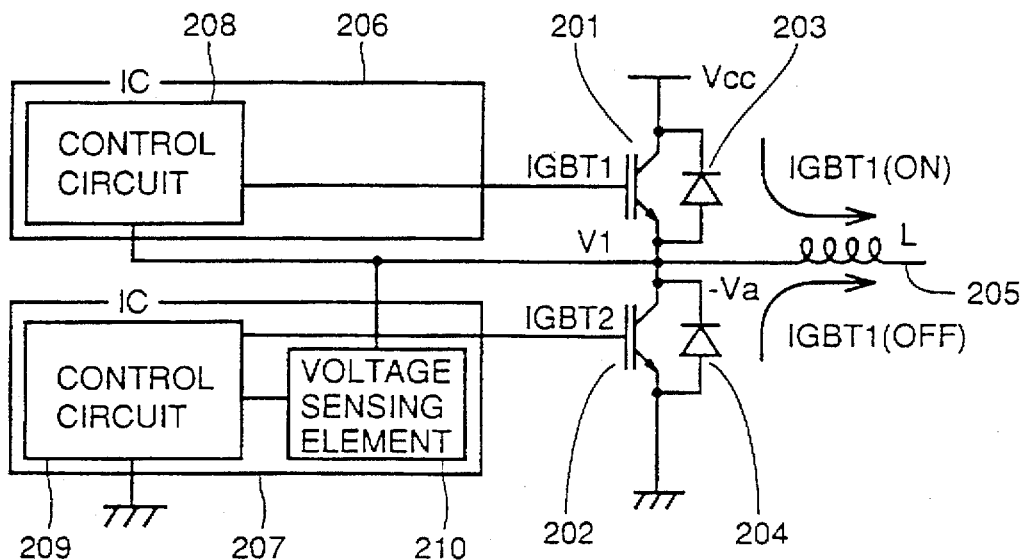
FIG. 5 is an equivalent circuit diagram showing a semiconductor device (circuit for driving a motor) including a voltage sensing element in accordance with a second embodiment of the present invention.
Figure 6:
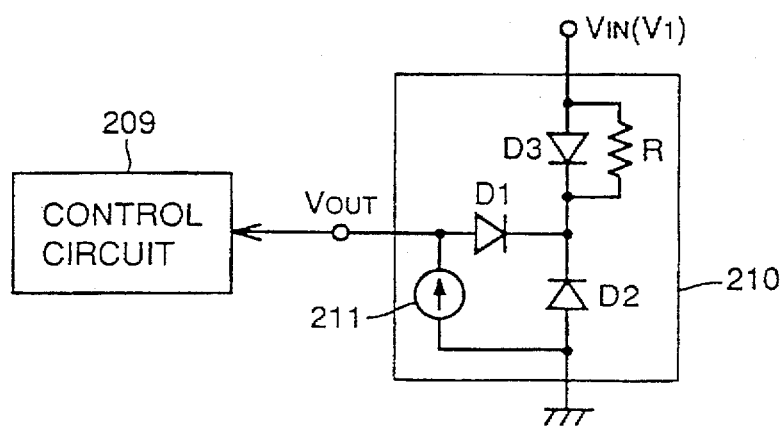
FIG. 6 is an equivalent circuit diagram showing a circuitry of the voltage sensing element of the second embodiment shown in FIG. 5.

Referring to FIGS. 5 and 6, one application of a voltage sensing element to a circuit for driving a motor is illustrated in a second embodiment. In this circuit for driving a motor, a power device bridge consisting of insulated gate bipolar transistors 201 and 202 is connected to a $V_{cc}$ power source. A diode 203 is connected to an emitter and a collector of insulated gate bipolar transistor 201. A diode 204 is connected to an emitter and a collector of insulated gate bipolar transistor 202.

An inductance coil 205 of the motor is connected to the connecting point of insulated gate bipolar transistors 201 and 202. Insulated gate bipolar transistor 201 has a gate connected to a control circuit 208 within an IC 206, and insulated gate bipolar transistor 202 has a gate connected to a control circuit 209 within an IC 207. The connecting point of insulated gate bipolar transistors 201 and 202 is connected to a voltage sensing element 210. The voltage sensing element 210 is connected to control circuits 208 and 209.

Voltage sensing element 210 of the second embodiment includes diodes D1 and D2 and a constant-current source 211, as voltage sensing element 108 shown in FIG. 2. Voltage sensing element 210 further includes a diode D3 and a resistor R. Diode D3 has an anode connected to an input terminal $V_{IN}$, and a cathode connected to cathodes of diode D1 and D2. Resistor R is connected to the cathode and the anode of diode D3.

Figure 7:
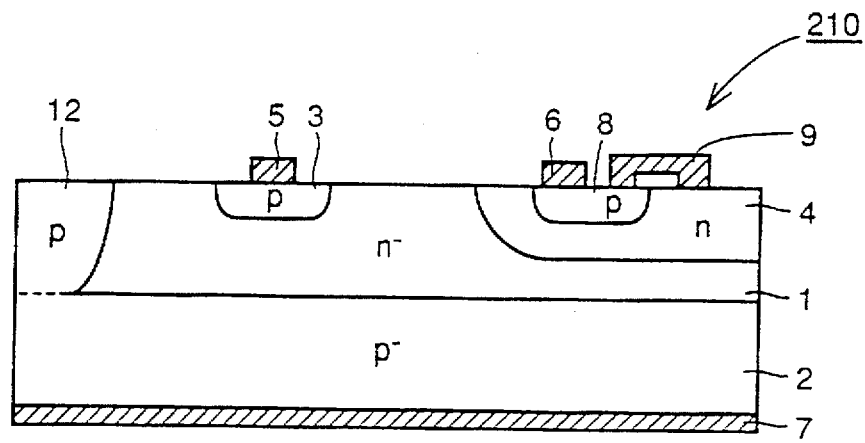
FIG. 7 is a cross sectional view showing a structure of the voltage sensing element of the second embodiment shown in FIG. 6.

The cross sectional structure of voltage sensing element 210 of the second embodiment shown in FIG. 6 will be described with reference to FIG. 7. An n⁻ layer 1 is formed on a p⁻ substrate 2. A p type diffused region 3 and an n type diffused region 4 are formed, spaced apart by a prescribed distance, at a main surface of n⁻ layer 1. A p type diffused region 12 is formed spaced apart from p type diffused region 3 by a prescribed distance, and extending from the main surface of n⁻ layer 1 to p⁻ substrate 2.

A p type diffused region 8 is formed at a main surface of n type diffused region 4. An electrode 5 is formed in contact with a surface of p type diffused region 3. An electrode 6 is formed in contact with a surface of p type diffused region 8. A conductive layer 9 is formed in contact with surfaces of p type diffused region 8 and n type diffused region 4. An electrode 7 is formed on a bottom surface of p⁻ substrate 2.

Figure 8:
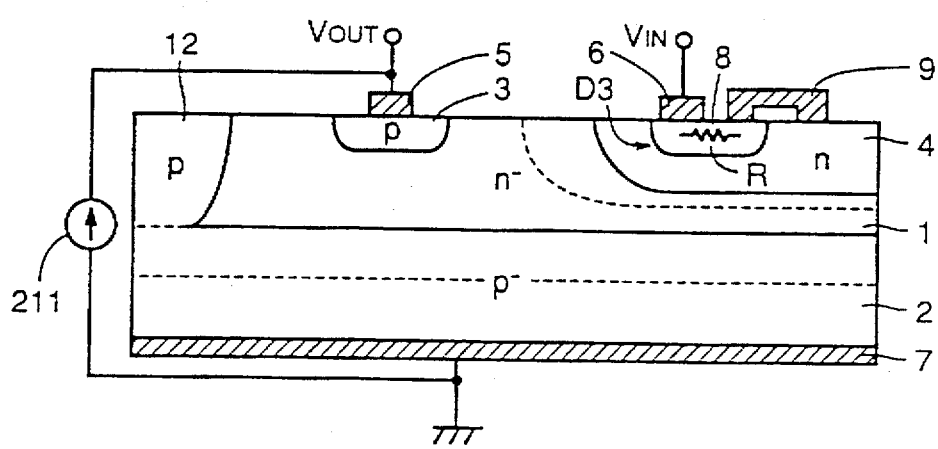
FIG. 8 is a cross sectional view showing operation of the voltage sensing element of the second embodiment shown in FIG. 7.

Referring to FIGS. 6 and 8, operation of voltage sensing element 210 of the second embodiment will be described. First, as shown in FIG. 8, electrode 7 is connected to ground and a positive voltage is applied to electrode 6 (input terminal). A depletion layer extends upward and downward from a junction region of n⁻ layer 1 and p⁻ substrate 2. As in the first embodiment shown in FIG. 4, electrode 5 (output terminal) is in a floating state in the depletion layer. As a result, the voltage of electrode 5 correlates with change in the voltage of electrode 6 and is lower than the voltage of electrode 6. Therefore, the voltage of the input terminal (electrode 6) can be obtained as a lower voltage from the output terminal (electrode 5).

Furthermore, the following inconvenience can be resolved in the second embodiment. In the circuit for driving a motor shown in FIG. 5, when insulated gate bipolar transistor (IGBT1) 201 is turned off, a current flows through diode 204 in a forward bias direction due to the electric power generated by inductance L of inductance coil 205. The potential of the cathode of diode 204 comes to be −Va due to voltage drop of diode 204. The potential $V_1$ of the junction point of insulated gate bipolar transistors 201 and 202 also comes to be −Va. As a result, the potential of electrode 6 of voltage sensing element 210 (shown in FIG. 8) becomes lower than that of electrode 7.

Figure 9A:
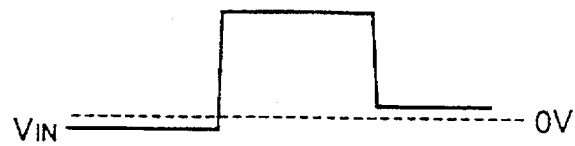
FIGS. 9A and 9B are input and output waveforms respectively, showing an inconvenience encountered when the voltage sensing element of the first embodiment is applied to a circuit for driving a motor.
Figure 9B:
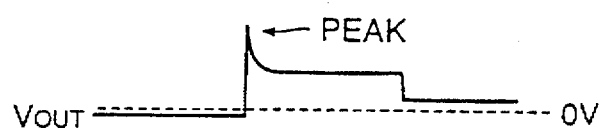

In this state, with the structure of the first embodiment, since the junction between n⁻ layer 1 and p⁻ substrate 2 is forwardly biased, holes are introduced from p⁻ substrate 2 to n⁻ layer 1. As a result, when the potential of electrode 6 increases in the positive direction again, formation of the depletion layer is delayed. Consequently, an inconvenience arises that the potential of p type diffused region 3 instantly increases. Specifically, as shown in FIG. 9B, a peak is generated in the potential of the output terminal (electrode 5). Such a peak voltage results in malfunction or destruction of control circuit 209 connected to electrode 5.

With the structure of the second embodiment shown in FIG. 8, a current flows through the junction between n⁻ layer 1 and p⁻ substrate 2, thereby generating a voltage across a diffusion resistor R in p type diffused region 8. Specifically, the current flowing from p⁻ substrate 2 toward n⁻ layer 1 further flows through n type diffused region 4, conductive layer 9 and p type diffused region 8 to electrode 6. When the current flows through p type diffused region 8, the current also flows through diffusion resistor R, thereby generating a voltage. A forward bias voltage between n⁻ layer 1 and p⁻ substrate 2 decreases by the amount of the voltage generated. As a result, less holes are introduced from p⁻ substrate 2 to n⁻ layer 1, and the depletion layer is rapidly formed when the potential of electrode 6 increases in the positive direction again. Consequently, an inconvenience of instant increase in the potential of p type diffused region 3, which is caused by applying the structure of the voltage sensing element of the first embodiment to a circuit for driving a motor, can be resolved.

When the potential of electrode 6 increases in the positive direction, a current flows by the release of electric charges which have been stored in the capacitance between p⁻ substrate 2 and n type diffused region 4. At this time, the current is short-circuited by forward bias of diode D3 constituted by n type diffused region 4 and p type diffused region 8. As a result, it is possible to avoid the problem that formation of the depletion layer is delayed due to voltage drop at diffusion resistor R when the potential of electrode 6 increases in the positive direction. Thereby, a delay of a signal to be output to electrode 5 can be avoided. That is, in voltage sensing element 210 of the second embodiment, a short circuit is made by diode D3 when the potential of electrode 6 increases in the positive direction, and a current flows through diffusion resistor R when the potential of electrode 6 is negative.

Figure 10:
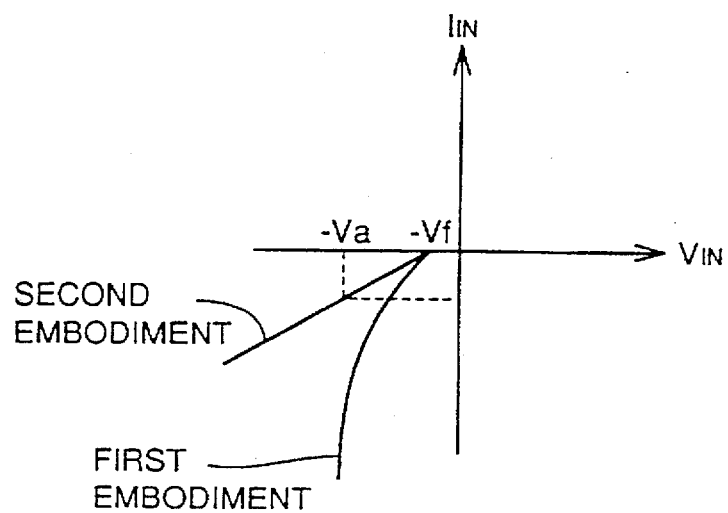
FIG. 10 is an illustration showing current-voltage characteristics between electrodes 6 and 7 in the first and second embodiments.

Referring to FIG. 10, when a negative voltage −Va is applied to electrode 6, the value of current in the first embodiment is less than in the second one. This means that when negative bias voltage −Va is applied to electrode 6, the value of current is effectively restricted by diffusion resistor R in the second embodiment. It can be understood that no current flows until a bias voltage reaches threshold voltage $V_f(-V_f)$ of diode D2 consisting of n⁻ layer 1 and p⁻ substrate 2.

Figure 11:
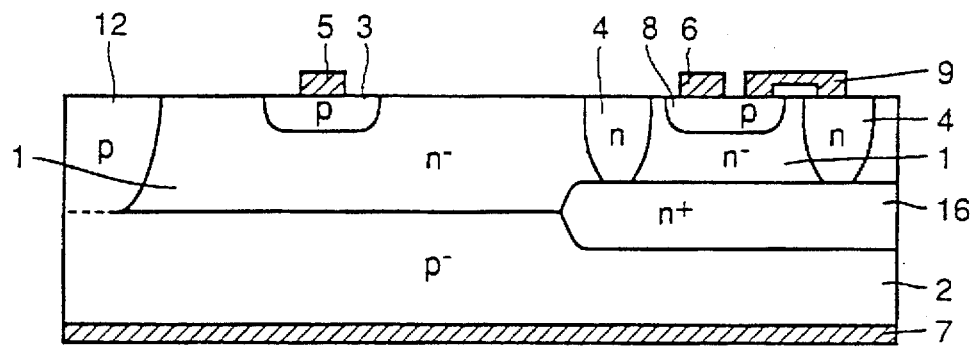
FIGS. 11-13 are cross sectional views showing the structure of a voltage sensing element in a semiconductor device including the voltage sensing element in accordance with third through fifth embodiments respectively of the present invention.

Referring to FIG. 11, an equivalent circuit diagram of a voltage sensing element in a third embodiment is identical to that of the second embodiment shown in FIG. 6. In a semiconductor device of the third embodiment, a region corresponding to n type diffused region 4 of the second embodiment is constituted by an n type diffused region 4, an n⁺ buried diffused region 16, and an n⁻ layer 1 surrounded by n type diffused region 4 and n⁺ buried diffused region 16. The rest of the structure is identical to that of the second embodiment shown in FIG. 7. Operation is the same as in the second embodiment.

In the above described structure according to the third embodiment, a manufacturing process for a conventional bipolar transistor can be utilized in the third embodiment without any change, thereby providing more simplified manufacturing process. That is, the structure of the second embodiment shown in FIG. 7 requires an advanced technology in the process for forming n type diffused region 4 covering p type diffused region 8. In contrast, a conventional manufacturing process for a bipolar transistor can be utilized without any change in the structure of the third embodiment shown in FIG. 11, thereby providing more simplified manufacturing process than in the second embodiment.

Figure 12:
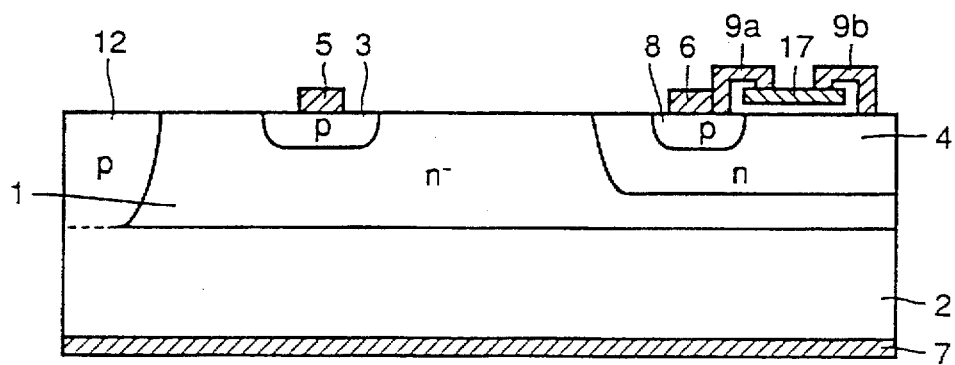

Referring to FIG. 12, an equivalent circuit diagram of a voltage sensing element in a semiconductor device of a fourth embodiment is identical to that in the second embodiment shown in FIG. 6. In the fourth embodiment, not the diffusion resistor in p type diffused region 8 but a polysilicon film 17 is used as a resistor R. In this case, polysilicon film 17 is electrically connected to p type diffused region 8 through a conductive layer 9a. Polysilicon film 17 is also electrically connected to an n type diffused region 4 through a conductive layer 9b. Conductive layer 9a and an electrode 6 are formed in contact with each other. The rest of the structure is identical to that of voltage sensing element 210 of the second embodiment shown in FIG. 7. Operation thereof is also identical to that of the voltage sensing element of the second embodiment.

Figure 13:
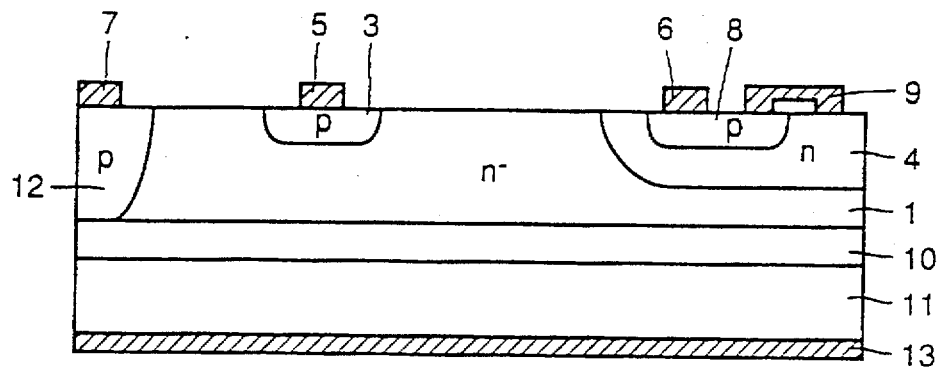

Referring to FIG. 13, in a semiconductor device of a fifth embodiment, an insulating film 10 is posed between a p-type or n-type semiconductor substrate 11 and an n⁻ layer 1. A p type diffused region 3 and an n type diffused region 4 are formed, spaced apart by a prescribed distance, at a main surface of n⁻ layer 1.

A p type diffused region 12 is formed at the main surface of n⁻ layer 1, spaced apart from p type diffused region 3 by a prescribed distance and reaching insulating film 10. A p type diffused region 8 is formed at a main surface of n type diffused region 4. P type diffused region 8 has a diffusion resistor R. An electrode 5 is formed in contact with a main surface of p type diffused region 3. An electrode 7 is formed in contact with a main surface of P type diffused region 12. An electrode 6 is formed in contact with a main surface of p type diffused region 8. A conductive layer 9 is formed in contact with surfaces of p type diffused region 8 and n type diffused region 4. A substrate electrode 13 is formed on a bottom surface of semiconductor substrate 11. An equivalent circuit diagram of a voltage sensing element of the fifth embodiment is identical to that of the voltage sensing element of the second embodiment shown in FIG. 6.

Figure 14:
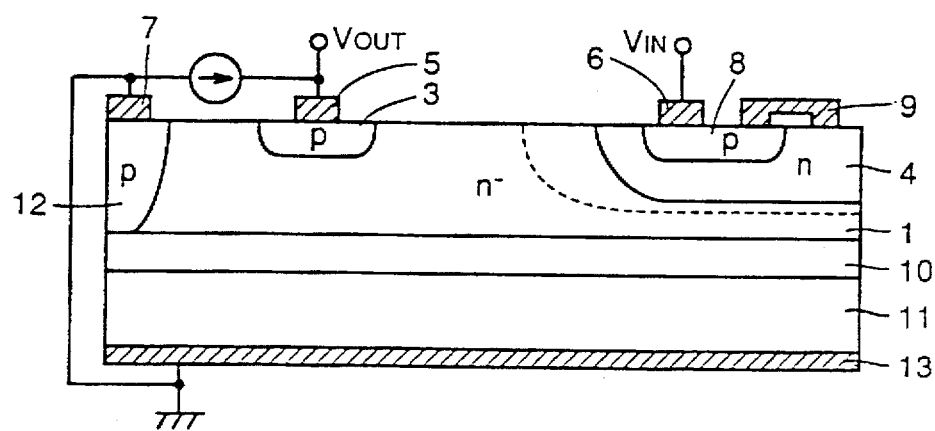
FIG. 14 is a cross sectional view showing operation of the semiconductor device of the fifth embodiment shown in FIG. 13.

Next, operation of the voltage sensing element in the fifth embodiment will be described with reference to FIG. 14. First, electrode 7 and substrate electrode 13 are connected to the ground. A positive voltage is applied to electrode 6. As a result, a depletion layer extends from a junction region of n⁻ layer 1 and p type diffused region 12 to the region represented by the dotted line in the figure. Formation of the depletion layer and field plate effect of electrode 13 put diode D1, consisting of p type diffused region 12 and n⁻ layer 1, in a reversely biased state. At this time, electrode 5 is in the floating state in the depletion layer.

Consequently, the voltage of electrode 5 correlates with change in the voltage of electrode 6 and is lower than the voltage of electrode 6. If a constant current is supplied to electrode 5 from constant-current source 211, the potential of electrode 5 in a floating state can be stably obtained, thereby making it possible to obtain the voltage of electrode 6 (input terminal) as a lower voltage from electrode 5 (output terminal).

If the potential of electrode 6 becomes lower than that of electrode 7, diode D1 consisting of n⁻ layer 1 and p type diffused region 12 is forwardly biased, and a current flows through diode D1. However, the current generates a voltage across diffusion resistor R in p type diffused region 8, thereby decreasing forward bias of diode D1 by the amount associated with voltage drop at diffusion resistor R. As a result, less holes are introduced from p type diffused region 12 to n⁻ layer 1. Therefore, when the potential of electrode 6 increases in the positive direction again, the depletion layer is rapidly formed, thereby avoiding the inconvenience of instant increase in the potential of p type diffused region 3.

When the potential of electrode 6 increases in the positive direction, a current flows by the release of electric charges which have been stored in the capacitance between p type diffused region 12 and n type diffused region 4. However, this current is short-circuited by forward bias of diode D3 formed of n type diffused region 4 and p type diffused region 8. As a result, it is possible to avoid the problem that formation of the depletion layer is delayed due to voltage drop at diffusion resistor R when the potential of electrode 6 increases in the positive direction. Thereby, a delay of a signal to be output to electrode 5 can be avoided.

Figure 15:
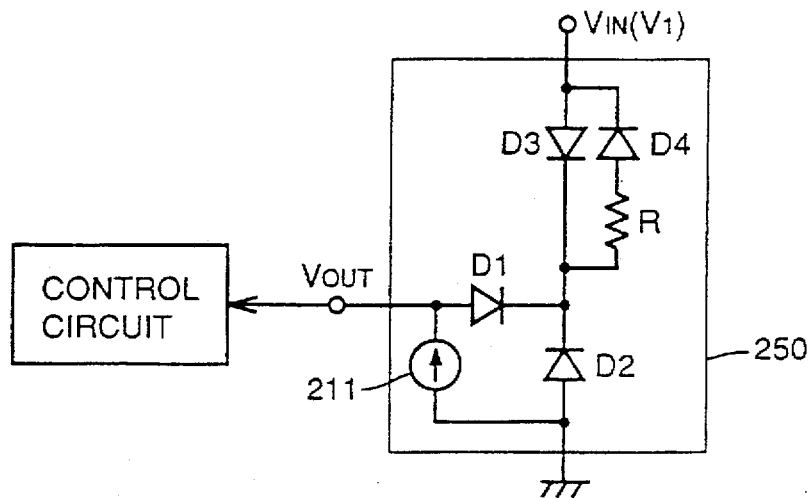
FIG. 15 is an equivalent circuit diagram of a voltage sensing element portion in a semiconductor device including the voltage sensing element in accordance with a sixth embodiment of the present invention.
Figure 16:
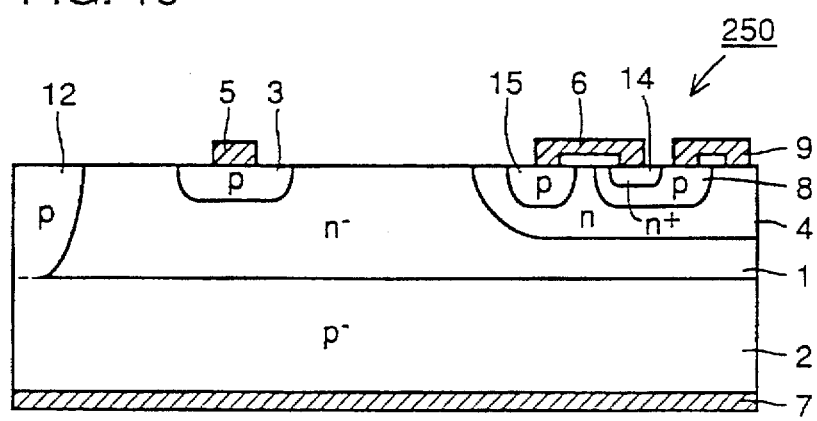
FIG. 16 is a cross sectional view showing the structure of the voltage sensing element of the sixth embodiment shown in FIG. 15.

Referring to FIG. 15, a voltage sensing element 250 of a sixth embodiment includes diodes D1–D3, a constant-current source 211 and a resistor R, as voltage sensing element 210 of the second embodiment shown in FIG. 6. In the sixth embodiment, a diode D4 is located in a forward bias direction between resistor R and an anode of diode D3.

In the cross sectional structure of voltage sensing element 250, p type diffused regions 15 and 8 are formed at a main surface of an n type diffused region 4, spaced apart by a prescribed distance. An n⁺ diffused region 14 is formed at a main surface of p type diffused region 8. An electrode 6 is formed in contact with surfaces of p type diffused region 15 and n⁺ diffused region 14. A conductive layer 9 is formed in contact with surfaces of p type diffused region 8 and n type diffused region 4. P type diffused region 8 includes a diffusion resistor R. The rest of the structure is identical to that of the voltage sensing element of the second embodiment shown in FIG. 7.

Figure 17:
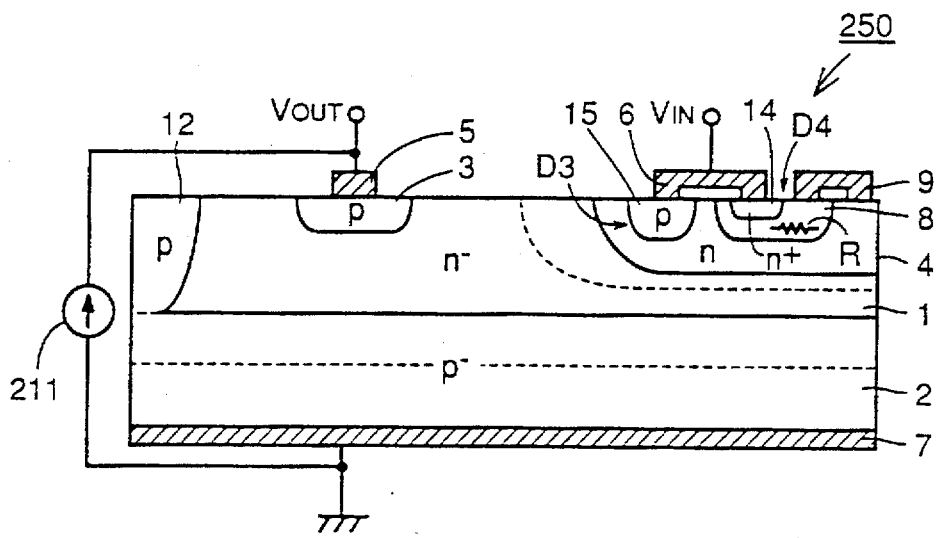
FIG. 17 is a cross sectional view showing operation of the voltage sensing element of the sixth embodiment shown in FIG. 16.

Next, operation of the voltage sensing element in the sixth embodiment will be described with reference to FIG. 17. First, an electrode 7 is connected to the ground and a positive voltage is applied to electrode 6. A depletion layer extends upward and downward from a junction region of an n⁻ layer 1 and a p⁻ substrate 2. As a result, a reverse bias voltage is applied to diode D2 consisting of p⁻ substrate 2 and n⁻ layer 1. At this time, an electrode 5 is in a floating state in the depletion layer. Consequently, the voltage of electrode 5 correlates with change in the voltage of electrode 6 and is lower than the voltage of electrode 6. If a constant current is supplied from a constant-current source 211 to electrode 5, the potential of electrode 5 in a floating state can be stably obtained. By utilizing such operation, the voltage of electrode 6 (input terminal) can be obtained as a lower voltage from electrode 5 (output terminal).

When the potential of electrode 6 becomes lower than that of electrode 7, a forward bias voltage is applied to diode D2 consisting of n⁻ layer 1 and p⁻ substrate 2, and a current flows through diode D2 in the forward direction. However, this current generates a voltage across diffusion resistor R in p type diffused region 8, thereby decreasing a forward bias voltage of diode D2 by the amount associated with the voltage generated by diffusion resistor R. Furthermore, the threshold voltage of diode D4 consisting of p type diffused region 8 and n⁺ diffused region 14 decreases a forward bias voltage of diode D2 by the amount associated with the threshold voltage. As a result, it is possible to reduce the amount of holes introduced from p⁻ substrate 2 to n⁻ layer 1 in comparison with the above-described second through fifth embodiments. Consequently, the depletion layer is more rapidly formed when the potential of electrode 6 increases in the positive direction again, thereby effectively resolving the inconvenience that the potential of p type diffused region 3 instantly increases.

When the potential of electrode 6 increases in the positive direction, a current flows by the release of the electric charges which have been stored in the capacitance between p⁻ substrate 2 and n type diffused region 4. However, this current is short-circuited by forward bias of diode D3 consisting of n type diffused region 4 and p type diffused region 15. Therefore, it is possible to avoid the problem that formation of the depletion layer is delayed due to reverse bias of diode D4 consisting of p type diffused region 8 and n⁺ diffused region 14. As a result, a delay of a signal to be output to electrode 5 can be avoided.

Figure 18:
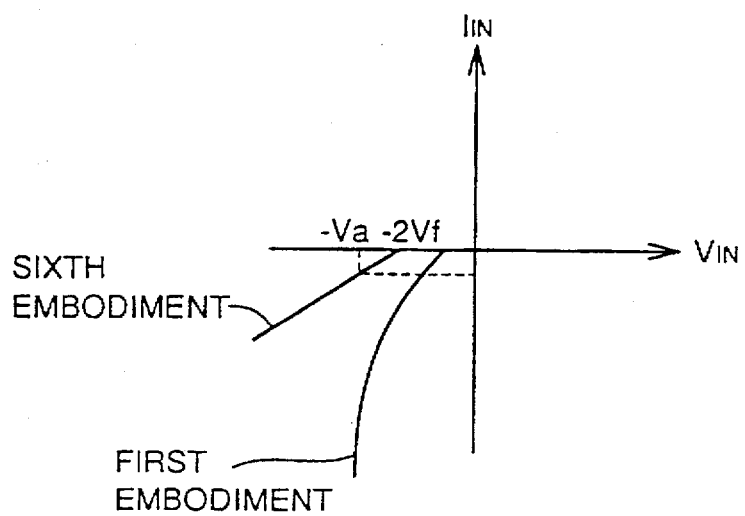
FIG. 18 is an illustration showing current-voltage characteristics between electrodes 6 and 7 in the first and sixth embodiments.
Figure 19:
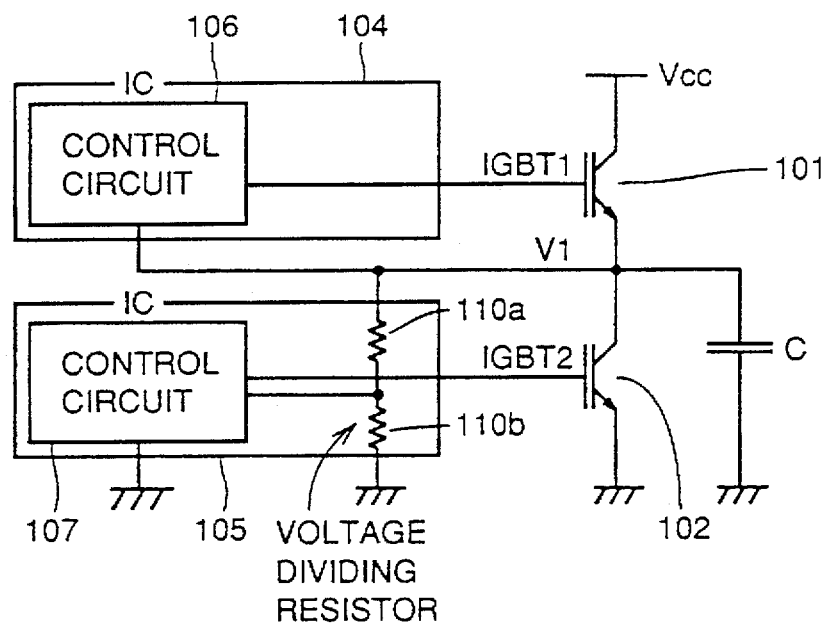
FIG. 19 is an equivalent circuit diagram showing a conventional semiconductor device (circuit for driving a fluorescent lamp) including a voltage sensing element having a voltage dividing resistor circuit.

Referring to FIG. 18, it is noted that the value of the current when a negative bias voltage −Va is applied to electrode 6 is effectively restricted by voltage drop due to diffusion resistor R and by threshold voltage Vf of diode D4 in the sixth embodiment. That is, in the first embodiment, a current starts to flow when a negative bias voltage larger than threshold voltage Vf (−Vf) of diode D2 is applied. In contrast, in the sixth embodiment, a current flows only when a negative voltage larger than the sum 2Vf (−Vf) of threshold voltage Vf of diode D2 and threshold voltage Vf of diode D4 is applied. It is also noted that the current-voltage line is less steep in the sixth embodiment than in the first embodiment because of diffusion resistor R.

As described above, in a semiconductor device in accordance with one aspect of the present invention, by adapting a diode consisting of first and second semiconductor layers to be reversely biased, very little current flows through the diode, thereby allowing reduction in power consumption in comparison with a conventional voltage sensing element consisting of a voltage dividing resistor circuit. Since the voltage of a first electrode on a first semiconductor region is almost the same as that of a second electrode on a second semiconductor region until a depletion layer extending upward and downward from a junction region of the first and second semiconductor layers comes into contact with the first semiconductor region, it is possible to obtain a sufficient voltage from the first electrode to secure accuracy in sensing voltage even when the voltage applied to the second electrode is small.

In a semiconductor device in accordance with another aspect of the present invention, it is possible to reduce a forward bias voltage across a diode consisting of first and second semiconductor layers due to voltage drop at a resistor formed between second and third semiconductor regions. As a result, a depletion layer can be rapidly formed when the potential of a second electrode increases again and a reverse bias voltage is applied to the diode, thereby avoiding an inconvenience that the potential of a first semiconductor region instantly increases.

In a semiconductor device in accordance with a further aspect of the present invention, by adapting a diode formed of a first semiconductor region and a first semiconductor layer so that a reverse bias voltage is applied thereto, it is possible to reduce power consumption and to increase a voltage obtained from a second electrode on a second semiconductor region in comparison with a conventional device, even when a voltage input to a third electrode on a fourth semiconductor region is small. It is also possible to reduce a forward bias voltage applied to the diode consisting of the first semiconductor region and the first semiconductor layer due to a resistor formed between third and fourth semiconductor regions.

In a semiconductor device in accordance with a further aspect of the present invention, it is possible to more effectively reduce a forward bias voltage of a diode consisting of first and second semiconductor layers due to voltage drop at a resistor formed between second and fourth semiconductor regions and due to a threshold voltage of a diode consisting of fourth and fifth semiconductor regions.

In a semiconductor device in accordance with a further aspect of the present invention, it is possible to reduce power consumption, in comparison with a conventional voltage sensing element consisting of a voltage dividing resistor circuit, by arranging first and second rectifying elements in a reversely biased state.

In a semiconductor device in accordance with a further aspect of the present invention, it is possible to reduce a forward bias voltage of a second rectifying element by voltage drop due to a resistor.

Although the present invention has been described and illustrated in detail, it is clearly understood that the same is by way of illustration and example only and is not to be taken by way of limitation, the spirit and scope of the present invention being limited only by the terms of the appended claims.

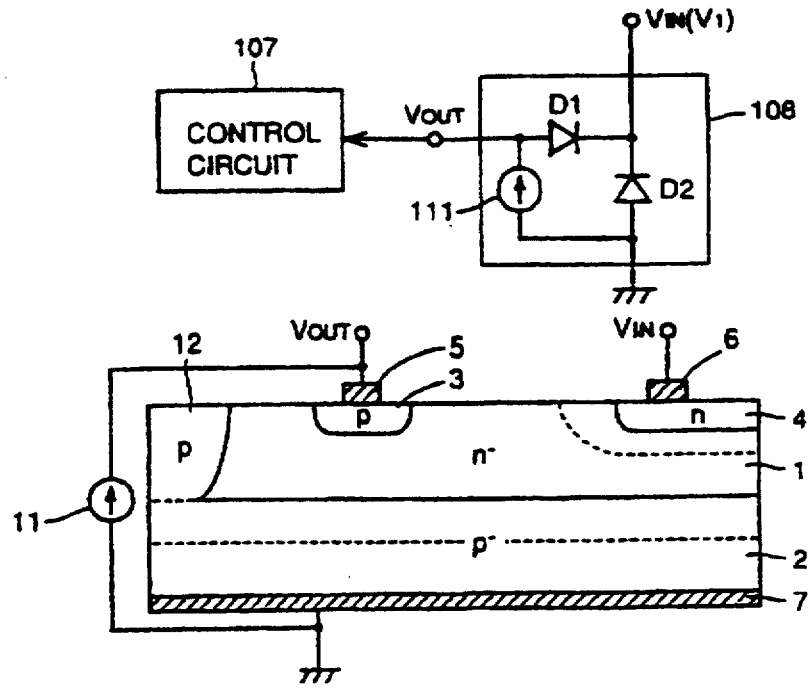

What is claimed is:

1. A semiconductor device having a voltage sensing element for sensing an output voltage, said voltage sensing element comprising:

an input terminal supplied with said output voltage;

an output terminal for supplying voltage produced by said voltage sensing element to an external circuit;

a first rectifying element having a cathode connected to said input terminal and an anode connected to said output terminal;

a second rectifying element having a cathode connected to said input terminal and an anode connected to a ground terminal, the cathode of said first rectifying element and the cathode of said second rectifying element including a common semiconductor region provided to make said first and second rectifying elements reversely biased, in order to increase voltage at the anode of said first rectifying element with respect to voltage at the cathodes of said first and second rectifying elements, said common semiconductor region including a depletion layer formed when voltage being applied to the cathode of said second rectifying element, to provide a direct path for a current flow from the anode of said first rectifying element to the anode of said second rectifying element; and a constant-current source connected between the anode of said first rectifying element and the anode of said second rectifying element.

2. A semiconductor device having a voltage sensing element for sensing an output voltage, said voltage sensing element comprising;

an input terminal supplied with said output voltage;

an output terminal for supplying voltage produced by said voltage sensing element to an external circuit;

a first rectifying element having a cathode and an anode connected to said output terminal;

a second rectifying element having a cathode connected to the cathode of said first rectifying element and an anode connected to a ground terminal, the cathode of said first rectifying element and the cathode of said second rectifying element including a common semiconductor region provided to make said first and second rectifying elements reversely biased, in order to increase voltage at the anode of said first rectifying element with respect to voltage at the cathodes of said first and second rectifying elements, said common semiconductor region including a depletion layer formed when voltage being applied to the cathode of said second rectifying element, to provide a direct path for a current flow from the anode of said first rectifying elements to the anode of said second rectifying element;

a third rectifying element having an anode connected to said input terminal and a cathode connected to the cathodes of said first and second rectifying elements;

a resistor connected between the anode and the cathode of said third rectifying element; and a constant-current source connected between the anode of said first rectifying element and the anode of said second rectifying element.

3. The semiconductor device according to claim 2, wherein a fourth rectifying element is provided between said resistor and the anode of said third rectifying element so that a rectified current flows from said resistor to the anode of said third rectifying element.

4. The semiconductor device according to claim 1, wherein the voltage on said output terminal correlates with the output voltage on said input terminal.

5. The semiconductor device of claim 1, wherein said first rectifying element comprises a first semiconductor region of a first conductivity type and said common semiconductor region of a second conductivity type, and said second rectifying element comprises a second semiconductor region of said first conductivity type and said common semiconductor region of said second conductivity type.

6. The semiconductor device of claim 2, wherein said first rectifying element comprises a first semiconductor region of a first conductivity type and said common semiconductor region of a second conductivity type, and said second rectifying element comprises a second semiconductor region of said first conductivity type and said common semiconductor region of said second conductivity type.

* * * * *

UNITED STATES PATENT AND TRADEMARK OFFICE
CERTIFICATE OF CORRECTION

PATENT NO. : 5,726,598
DATED : March 10, 1998
INVENTOR(S) : Tomohide TERASHIMA et al.

It is certified that error appears in the above-indentified patent and that said Letters Patent is hereby corrected as shown below:

On the title page, the figures should be as follows:
--

Signed and Sealed this

Fourth Day of August, 1998

--

Attest:

BRUCE LEHMAN

Attesting Officer

Commissioner of Patents and Trademarks

United States Patent
Terashima et al.

Patent Number: 5,726,598
Date of Patent: Mar. 10, 1998

[54] SEMICONDUCTOR DEVICE HAVING VOLTAGE SENSING ELEMENT

[75] Inventors: Tomohide Terashima, Hyogo; Masanori Fukunaga, Fukuoka, both of Japan

[73] Assignee: Mitsubishi Denki Kabushiki Kaisha, Tokyo, Japan

[21] Appl. No.: 743,567

[22] Filed: Nov. 4, 1996

Related U.S. Application Data

[60] Continuation of Ser. No. 424,939, Apr. 19, 1995, abandoned, which is a division of Ser. No. 343,945, Nov. 17, 1994, Pat. No. 5,500,541.

[30] Foreign Application Priority Data

Apr. 27, 1994 [JP] Japan .................. 6-089462

[51] Int. Cl.$^6$ ................... H03K 5/153
[52] U.S. Cl. ............... 327/325; 327/583; 327/504; 327/80; 327/565
[58] Field of Search ............... 327/50, 80, 583, 327/325, 306, 309, 314, 315, 318, 320, 321, 322, 330, 471, 472, 493, 504, 585, 565; 257/105, 106, 481, 551, 603

[56] References Cited

U.S. PATENT DOCUMENTS

| | | | |
|---|---|---|---|
| 2,927,267 | 3/1960 | Petritz et al. | 327/504 |
| 4,119,869 | 10/1978 | Hashimoto | 327/583 |
| 4,198,607 | 4/1980 | Beinitz et al. | 327/50 |
| 4,211,941 | 7/1980 | Schade, Jr. | |
| 4,810,907 | 3/1989 | Tobyama | 327/80 |
| 4,926,068 | 5/1990 | Fujita | 327/50 |
| 5,329,190 | 7/1994 | Igarashi et al. | 327/80 |
| 5,467,050 | 11/1995 | Clapp, III et al. | 327/314 |

FOREIGN PATENT DOCUMENTS

| 0108945 | 5/1984 | European Pat. Off. |
| 16 39 177 B 2 | 7/1977 | Germany |

*Primary Examiner*—Timothy P. Callahan
*Assistant Examiner*—Eunja Shin
*Attorney, Agent, or Firm*—Lowe, Price, LeBlanc & Becker

[57] ABSTRACT

A semiconductor device having a voltage sensing element is disclosed which allows reduction of power consumption in comparison with a conventional device and enables to obtain a sufficient output voltage to secure sensing accuracy even when an input voltage is small. In the voltage sensing element of the semiconductor device, an n$^-$ layer is formed on a front surface of a p$^-$ substrate. A p type diffused region and an n type diffused region are formed at a main surface of n$^-$ layer, spaced apart by a prescribed distance. An electrode is formed on p type diffused region, and an electrode is formed on n type diffused region. An electrode is formed on a rear surface of p$^-$ substrate. P$^-$ substrate and n$^-$ layer constitute a diode in a reversely biased state. As a result, power consumption is reduced in comparison with a conventional voltage dividing resistor circuit.

6 Claims, 10 Drawing Sheets